United States Patent
Bhatti et al.

(12) 
(10) Patent No.: US 6,591,897 B1
(45) Date of Patent: Jul. 15, 2003

(54) HIGH PERFORMANCE PIN FIN HEAT SINK FOR ELECTRONICS COOLING

(75) Inventors: Mohinder Singh Bhatti, Amherst, NY (US); Shrikant Mukund Joshi, Williamsville, NY (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/079,214

(22) Filed: Feb. 20, 2002

(51) Int. Cl.[7] ................................................ H05K 7/20
(52) U.S. Cl. ...................... 165/80.3; 165/185; 165/907; 361/704
(58) Field of Search ................................ 165/80.3, 185, 165/907; 361/704, 710, 697; 257/719, 722

(56) References Cited

U.S. PATENT DOCUMENTS

| | | | |
|---|---|---|---|
| 3,616,841 A | 11/1971 | Walz | 164/34 |
| 3,946,039 A | 3/1976 | Walz | 264/332 |
| 4,808,558 A | 2/1989 | Park et al. | 501/80 |

FOREIGN PATENT DOCUMENTS

| | | | | |
|---|---|---|---|---|
| JP | 08-321569 A | * | 12/1996 | H01L/23/36 |
| JP | 10-190265 A | * | 7/1998 | H05K/7/20 |
| JP | 10-321774 A | * | 12/1998 | H01L/23/36 |

OTHER PUBLICATIONS

IBM TDB NN9707189 Jul. 1997, vol. 40 Issue 7 pps. 189–190.*
IBM TDB NN9604101 Apr. 1996, vol. 39 Issue 4 pps. 101–102.*
Bastawros, "Effectiveness of open–cell metallic foams for high power electronic cooling," Presented at IMECE, Nov. 15–20, 1998, Anaheim, CA, in Thermal Management of Electronics, ASME Conf. Proc. HTD–361–3/PID–3, 211–217.
Bastawros et al, "Evaluation of cellular metal heat transfer media," MECH 325, Mar. 1998 for review for publication in the Journal of Heat Transfer.

* cited by examiner

*Primary Examiner*—Allen Flanigan
(74) *Attorney, Agent, or Firm*—Patrick M. Griffin (57) ABSTRACT

A heat sink for electronic devices comprises a spreader plate having a top surface and having a bottom surface wherein a portion thereof is defined for affixing an electronic device to be cooled thereto. A plurality of columnar pins are spaced apart one from the other in a non-uniform manner and affixed to the top surface of the spreader plate substantially perpendicular thereto. A highly porous heat conducting reticulated foam block substantially fills a space defined by said spaced apart columnar pins.

26 Claims, 4 Drawing Sheets

HIGH PERFORMANCE PIN FIN HEAT SINK FOR ELECTRONICS COOLING

TECHNICAL FIELD

The present invention is directed to heat sinks in general, and more particularly to heat sinks for use in dissipating waste heat generated by electrical or electronic components and assemblies.

BACKGROUND OF THE INVENTION

High power electrical and electronic components continue to have an increasing demand for higher power dissipation within a relatively confined space. In order to provide for such higher power dissipation requirements while remaining suitably compact, several levels of thermal management are usually required at the device, sub-assembly and component level.

Figure 1:
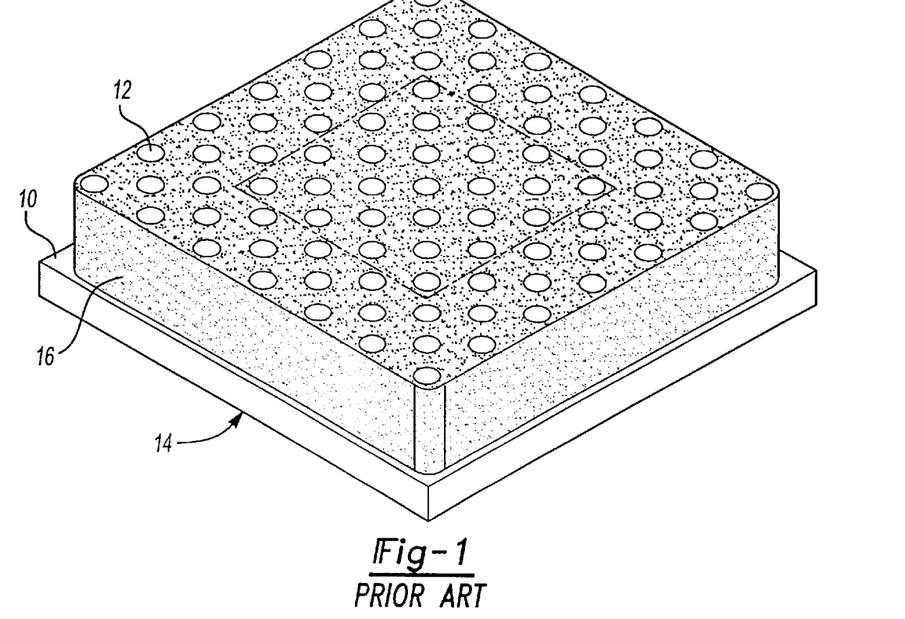
FIG. 1 is a perspective view of a prior art heat sink.

At the component level, various types of heat exchangers and heat sinks have been used that apply natural or forced convection or other cooling methods. A typical heat sink for electrical or electronic components employing pin fins and a foam is depicted in FIG. 1. As shown, the heat sink includes a heat spreader plate 10 to which metal pins 12 are attached. An electronic component is attached to face 14 of spreader plate 10 and a cooling fluid, such as air or water, is passed through foam 16 and across pins 12 to dissipate the heat generated by the electronic component.

In demanding applications, the method of heat exchange is usually forced convection to the cooling fluid. In such systems, heat exchange can be improved by increasing the pin surface area exposed to the cooling fluid. This is accomplished by increasing the number of the pins per unit volume. However, there are limitations to achievable pin densities based upon manufacturing constraints and cooling fluid flow requirements.

Reticulated foams are also known in the art for their ability to conduct heat such as the metal foams disclosed in U.S. Pat. Nos. 3,616,841 and 3,946,039 to Walz, and the ceramic foams disclosed in U.S. Pat. No. 4,808,558 to Park et al. Metal foams have been sold under the trade name DUOCEL available from Energy Research and Generation, Inc., Oakland, Calif.

Until recently, metal and ceramic reticulated foams have not been adapted for use in heat sinks for dissipating waste heat from electronic components. However, these structures, especially when comprised of metal, make excellent heat exchangers because of their conductivity and their extremely high surface area to volume ratio. While earlier porous heat exchangers had up to 100 open cells per square inch, reticulated foam has up to 15,625 open cells per square inch. Reticulated foam is far more porous and has far more surface area per unit volume (1600 square feet/cubic foot) than heat exchangers having other structures. The pressure drop of fluids flowing through reticulated foam is also relatively low so that movement of a cooling fluid through the foam is practical.

Studies by Bastawros have now shown the efficacy of metallic foams in forced convection heat removal for cooling of electronics. See, Bastawros, A.-F., 1998, *Effectiveness of Open-Cell Metallic Foams for High Power Electronic Cooling*, ASME Conf. Proc. HTD-361-3/PID-3, 211–217, and Bastawros, A.-F., Evans, A. G. and Stone, H. A., 1998, *Evaluation of Cellular Metal Heat Transfer Media*, Harvard University report MECH 325, Cambridge, Mass. Bastawros demonstrated that the use of metallic foam improved heat removal rate with a moderate increase in the pressure drop. Bastawros' results were based on thermal and hydraulic measurements (on an open cell aluminum alloy foam having a pore size of 30 pores per inch) used in conjunction with a model based upon a bank of cylinders in cross-flow to understand the effect of various foam morphologies. The model prediction was extrapolated to examine the trade-off between heat removal and pressure drop. The measurements showed that a high performance cellular aluminum heat sink (i.e., aluminum foam) removed 2–3 times the usual heat flux removed by a pin-fin array with only a moderate increase in pressure drop.

Thus what is desired is a heat sink having pins and a foam surrounding the pins that is optimizable for a given application.

SUMMARY OF THE INVENTION

One aspect of the present invention is a heat sink for electronic devices comprising a spreader plate having a top surface and having a bottom surface wherein a portion thereof is defined for affixing an electronic device to be cooled thereto. A plurality of columnar pins are spaced apart one from the other in a non-uniform manner and affixed to the top surface of the spreader plate substantially perpendicular thereto. A highly porous heat conducting reticulated foam block substantially fills a space defined by said spaced apart columnar pins.

Another aspect of the present invention is a method of making a heat sink comprising a spreader plate, a plurality of columnar pins and a reticulated foam block for filling the space between the columnar pins, the method comprises the steps of selecting the spreader plate and defining a portion on the bottom surface of the spreader plate for affixing to an electronic device. A plurality of columnar pins are selected and affixed to the top surface of the spreader plate such that the columnar pins are arranged in a non-uniform density on the top surface of the spreader plate. A reticulated foam block is placed to fill the spaces between the columnar pins affixed to the spreader plate and is affixed to the spreader plate and to the plurality of columnar pins.

Yet another aspect of the present invention is a method of cooling electronic components with a heat sink of the type having a spreader plate with a plurality of columnar pins affixed in a non-uniform density to a top surface of the spreader plate and having a reticulated heat conducting foam filling the space between the plurality of columnar pins. The method comprises the steps of affixing the electronic device to a bottom surface of the spreader plate and arranging a first plurality of columnar pins to the top surface of the spreader plate over the electronic device at a greater density than a second plurality of columnar pins over the remainder of the spreader plate. The heat conducting foam is affixed to the spreader plate to fill the space between adjacent ones of the first and second columnar pins. A cooling fluid is passed over the top surface of the spreader plate and through the heat conducting foam.

These and other advantages of the invention will be further understood and appreciated by those skilled in the art by reference to the following written specification, claims and appended drawings.

DETAILED DESCRIPTION OF THE PREFERRED EMBODIMENT

Figure 2:
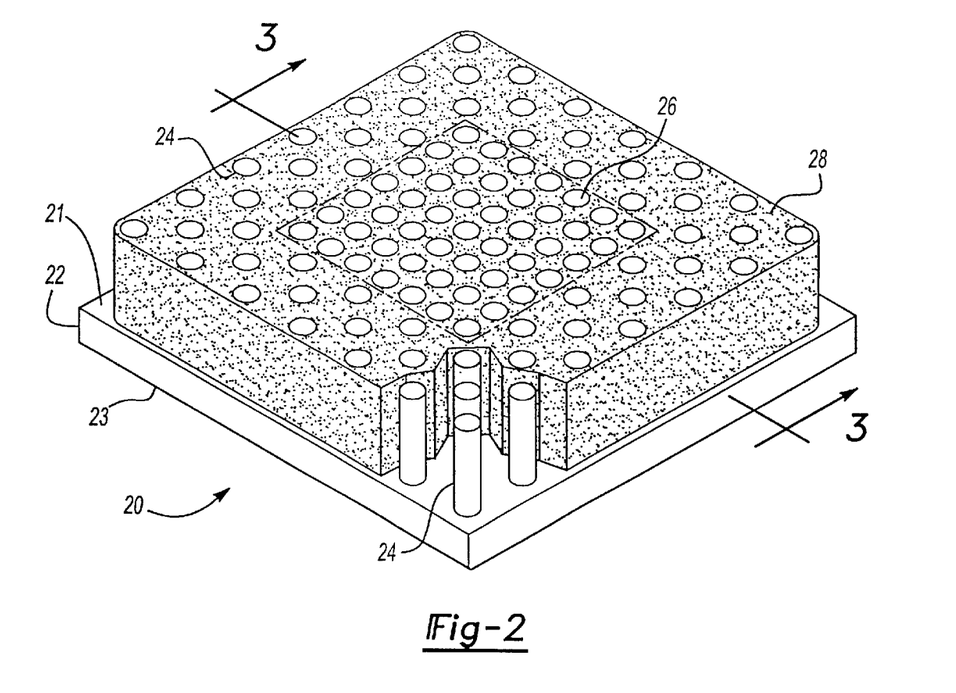
FIG. 2 is a perspective view of a heat sink embodying the present invention, wherein the density of pins is greater over the electronic device.

For purposes of description herein, the terms "upper", "lower", "left", "rear", "right", "front", "vertical", "horizontal", and derivatives thereof shall relate to the invention as oriented in FIG. 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

It has been discovered that there are constraints on the volume and geometry of reticulated foam beyond which the use of additional foam will have little impact on the overall heat sink's ability to dissipate thermal power at a given flow rate (i.e., the performance). This is because the reticulated foam is not a fully dense material (e.g., aluminum foam has a density of about 10% of solid aluminum). Therefore, a high convective heat transfer surface area is achieved at the expense of reduced thermal conductivity.

Additionally, in microelectronic cooling applications such as for example for microprocessors, practical considerations relative to package size, air flow rate, pressure drop and noise limits can impose further constraints on possible configurations and dimensions. Nonetheless, using the methods of the present invention, suitable heat sinks can be produced.

Heat sinks of the present invention achieve very high convective heat transfer surface per unit volume. These heat sinks comprise a spreader plate, a plurality of columnar pins, and a porous reticulated foam block that fill the space between the pins. This basic structure may be expanded to any configuration comprising foam blocks filling the space between the columnar pins that are mounted onto the surface of a spreader plate.

Primary heat transfer to the cooling fluid is by convection from the foam, with the pins and spreader plate being used to conduct heat from the connected heat source (i.e., the electronic component) into the foam. In air-to-air heat exchange (i.e., where air is being used as the cooling fluid), ambient air may be drawn in through the foam's open vertical side walls and exhausted through the foam's top surface, or vice versa. Providing such air can be accomplished using methods well known in the art. These methods include methods such as mounting an electrically powered fan to the top or a side of the heat sink or by attaching an air duct, through which cooling air is flowing, to the top or side of the heat sink.

Turning to the drawings, FIG. 2 shows a heat sink 20, which is one of the preferred embodiments of the present invention and illustrates its various components. As shown, heat sink 20 comprises a heat spreader plate 22, with outer columnar pins 24 and central columnar pins 26 mounted on a top surface 21 of the spreader plate 22 in a substantially perpendicular manner. The density of the outer pins 24 is lower than the density of the central pins 26. A reticulated foam block 28 fills the space in-between the pins. The pins 24, 26 and foam block 28 form an assembly that is mounted onto one surface of the spreader plate 22, leaving an opposing surface free for contact with an electronic component to be cooled.

Figure 3:
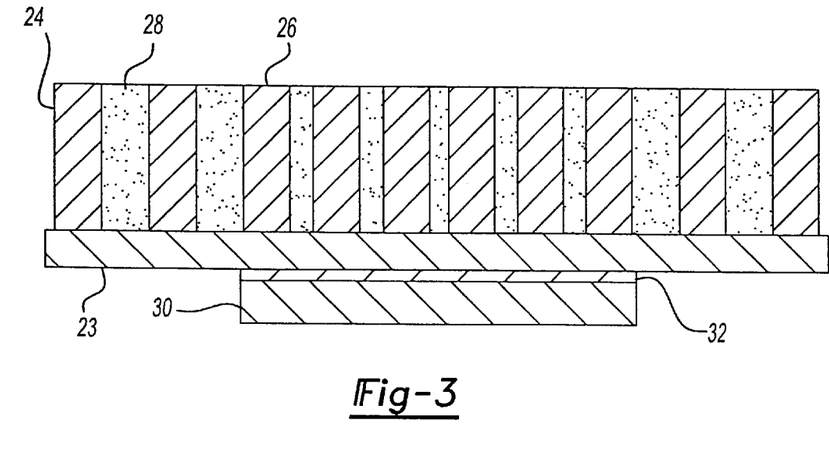
FIG. 3 is a cross-sectional view of the heat sink shown in FIG. 2 and taken along the line 3—3 of FIG. 2.

Referring to FIGS. 2–3, columnar pins 24, 26 are mounted so that they are substantially perpendicular to the top surface 21 of the spreader plate 22. Foam block 28 is mounted on spreader plate 22 and surrounds columnar pins 24, 26 to fill the region that defines the horizontal space between adjacent columnar pins. The foam block 28 also preferably fills the height region that defines the vertical space between adjacent columnar pins 24, 26 to the height of the columnar pins 24, 26. While FIGS. 2–3 show that the foam block 28 fills the height region, it is contemplated that in alternative embodiments the foam block 28 may partially fill or overfill the height region.

Figure 4:
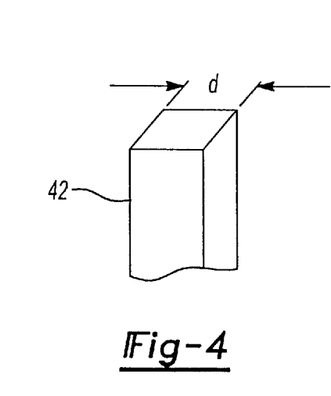
FIG. 4 is a segmented view of a square pin.
Figure 5:
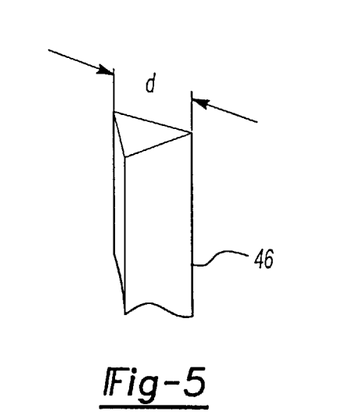
FIG. 5 is a segmented view of a triangular pin.
Figure 6:
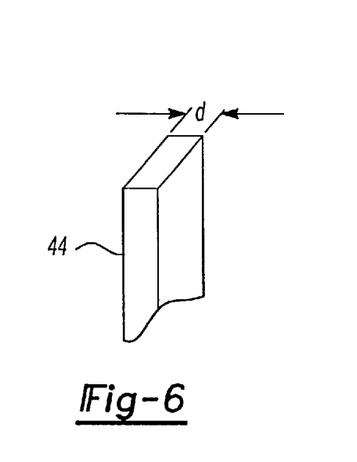
FIG. 6 is a segmented view of a rectangular pin.
Figure 7:
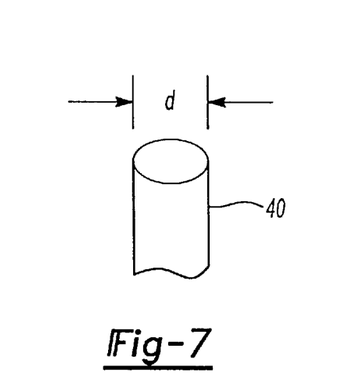
FIG. 7 is a segmented view of a round pin.

Columnar pins 24, 26 are generally columnar in nature, meaning that the height of each pin is substantially greater than its cross-sectional width. Columnar pins 24, 26 can assume a variety of shapes, such as: a square pin 42 having a width 'd' as shown in FIG. 4; an equilateral triangular pin 46 having a side dimension 'd' as shown in FIG. 5; a rectangular pin 44 having a width 'd' as shown in FIG. 6; or, a circular pin 40 having a diameter 'd' as shown in FIG. 7. Those practiced in the art will understand that other cross-section geometries can also be used.

Referring again to FIG. 3, An electronic device 30 such as a computer chip or other electronic device that requires heat dissipation is mounted on bottom surface 23 of spreader plate 22. Device 30 can be directly mounted to surface 23, or alternatively can be received in a recess (not shown) in spreader plate 22 defined by surface 23. A thermal conductive layer 32, commonly referred to as "thermal grease", is interposed between device 30 and spreader plate 22 to enhance the transfer of heat from device 30 to spreader plate 22.

Figure 8:
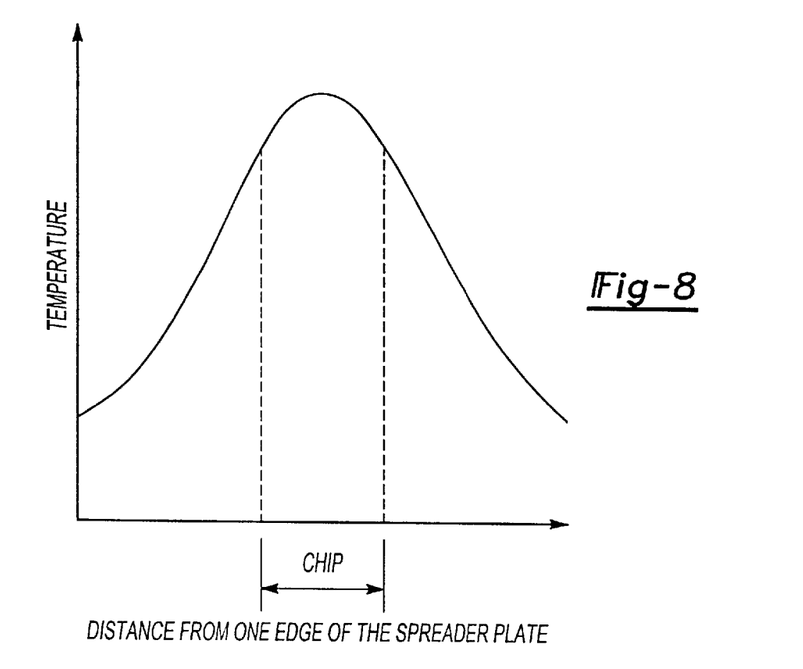
FIG. 8 is a graph of an idealized thermal distribution across the spreader plate.
Figure 9:
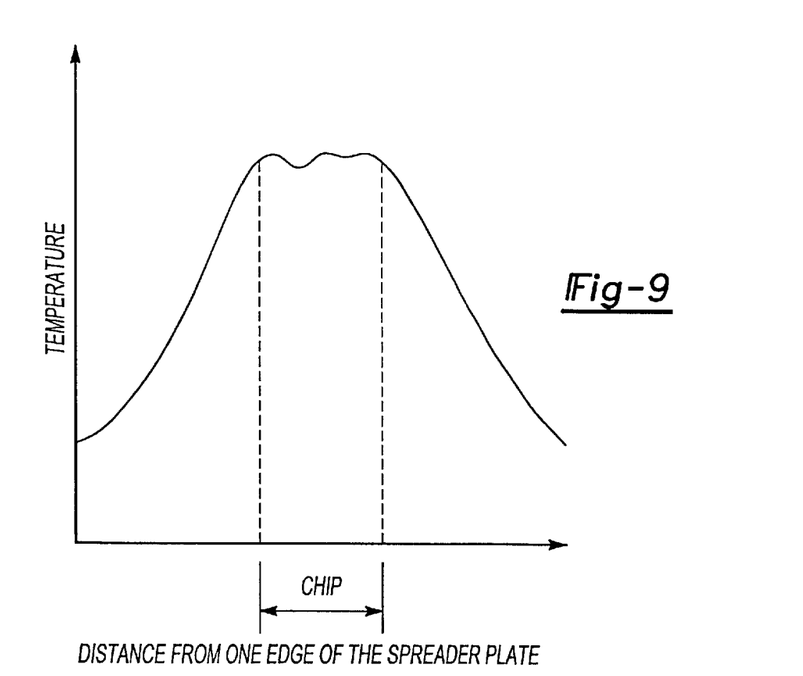
FIG. 9 is a graph of an actual thermal distribution across the spreader plate.

FIG. 8 illustrates the temperature distribution on the pin side of a spreader plate caused by an idealized chip generating uniform heat flux, and FIG. 9 shows the temperature distribution on the pin side of the spreader plate caused by a real chip generating non-uniform heat flux.

Since the pins conduct heat from the spreader plate for dissipation into the cooling fluid, it is evident from the temperature distributions of the graphs in FIGS. 8 and 9 that the pin density should be greater in the center of the spreader plate where the temperature is the highest than closer to the edge where the temperature is significantly lower. The prior art pins with uniform pin density over the spreader plate are thus not properly disposed to dissipate heat in an efficient fashion. Furthermore, the prior art spreader plates do not employ any heat transfer coefficient augmentation means to dissipate heat more efficiently into the flowing fluid stream.

In heat sink 20, the aforementioned deficiencies of the prior art heat sinks for electronics cooling are removed. This is achieved by the following means:

1. High density of pin pins where needed most.
2. Pin fins of optimized dimensions.
3. Pin fins embedded in a metallic foam block to enhance the heat transfer coefficient for efficient heat dissipation into the flowing fluid stream.

FIGS. 2–3 show the perspective and elevation views of heat sink 20. The density of columnar pins 26 in the center of the plate where the heat flux and hence the temperature is greater than the density of columnar pins 24 around the periphery of spreader plate 22 where the temperature is lower as illustrated by FIG. 9. Foam material 28 surrounds columnar pins 24, 26. The primary function of the columnar pins 24, 26 is to conduct heat from spreader plate 22 into the space between pins 24, 26 which is populated with foam block 28. The primary function of foam 28 is to enhance the heat transfer coefficient of the fluid stream that removes heat from the space between columnar pins 24, 26.

The selection of spreader plate size for a given power dissipation requirement, follow those techniques known in the art. The overall dimensions of the spreader plate are generally fixed based on the amount of heat to be dissipated from the surface of the heat source (such as a computer chip). The spreader plate surface area should be such that, for a prescribed flow rate of the cooling fluid flowing over the spreader plate, the heat from the heat source is able to spread to the edges of the spreader plate. Additional considerations may also be determinative of the spreader plate surface area such as packaging constraints.

Generally, however, spreader plate surface area is selected by multiplying the surface area of the heat source with the area magnification factor. The area magnification factor $F=A_s/A_h$ represents a ratio of the surface area of the heat source $A_h$ with the surface area of the spreader plate $A_s$. Typical values of F are in the range of 8 to 12, and are generally used in calculating spreader plate surface area for a given surface area of a heat source. From the standpoint of heat removal efficiency, F should be as low as possible. Highly effective heat transfer surfaces such as highly conductive pins of optimized dimensions and/or the use of heat transfer augmentation means such as reticulated foam provide for relatively low values of F. For example, if the surface area of the heat source is 1.5 in$^2$ and the selected area magnification factor is taken as F=8 (for highly efficient transfer), then the surface area of the spreader plate will be 8×1.5=12 in$^2$. For a spreader plate of this area, packaging considerations could prescribe a length of the plate in the flow direction to be 4 in. Then the width of the spreader plate will be 3 in.

The optimum height b of a pin fin of uniform cross section along its height is determined using the relation:

$$b = 0.919 \sqrt{\frac{k_f}{h} \frac{A_c}{p}} \quad (1)$$

where $k_f$ is the thermal conductivity of the pin material, Btu/ft s° F.

h is the convective heat transfer coefficient for the foam-filled space bounded by the pins and the spreader plate, Btu/ft$^2$ s° F.

$A_c$ is the cross sectional area of the pin, ft$^2$ p is the perimeter of the pin, ft The ratio of the cross sectional area $A_c$ to perimeter p for some simple pins are presented in Table 1.

TABLE 1

Ratio of Cross Sectional Area to Perimeter for Different pin Shapes

| Fin cross section | $A_c/p$ |
|---|---|
| Circular with diameter d | d/4 |
| Rectangular with thickness d | d/2 |
| Square with side d | d/4 |
| Equilateral triangular with side d | d/4√3 |

Since for a given perimeter, a circle encloses the maximum area, it is evident that for a given perimeter, the ratio $A_c/p$ is the maximum for circular pin. Thus, in accordance with Equation (1), the optimum height b is the maximum for the circular pin.

The heat transfer coefficient h entering Equation (1) for the foam-filled space can be determined using the formula:

$$h = 1.2704 \left[ \frac{n^{0.50}}{(1-\phi)^{0.25}} \right] \left( \frac{\rho^{0.50} k^{0.63} c_p^{0.37}}{\mu^{0.13}} \right) u_m^{0.50} \quad (2)$$

where:

n is the linear density of the foam material, pores per ft $\phi$ is the foam porosity expressed as a fraction $\rho$ is the density of the flowing fluid, lb$_m$/ft$^3$ k is the thermal conductivity of the flowing fluid, Btu/ft s° F.

$c_p$ is the isobaric specific heat of the flowing fluid, Btu/lb$_m$° F.

$\mu$ is the dynamic viscosity of the flowing fluid, lb$_m$/ft s $u_m$ is the mean velocity of the flowing fluid, ft/s.

Figure 10:
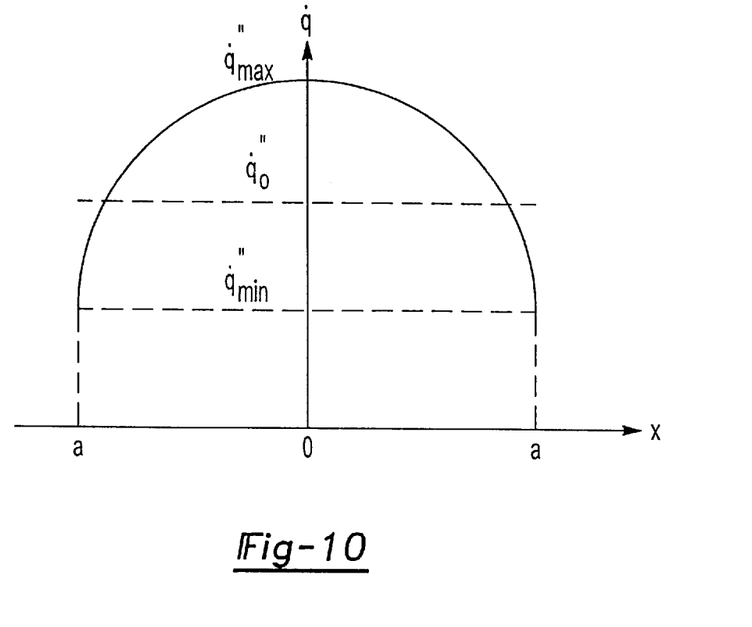
FIG. 10 is a graph of the non-uniform heat flux over the spreader plate as a cosine function.

Referring to FIG. 10, the non-uniform heat flux $\dot{q}''$ over the spreader plate can be represented by a cosine function as:

$$\dot{q}'' = \dot{q}''_o \left[ 1 + \alpha \cos\left(\frac{\pi x}{a}\right) \right] \quad (6)$$

where $\dot{q}''_o$ is the mean heat flux over the spreader plate, Btu/ft$^2$ $\alpha$ is a dimensionless constant dependent on the maximum and minimum values $\dot{q}''_{max}$ and $\dot{q}''_{min}$ of the heat flux $\dot{q}''$ (vide infra)

x is the variable distance measured from the center of the spreader plate along its width, ft a is the spreader plate half-width, ft.

The mean heat flux $\dot{q}''_o$ and the dimensionless constant $\alpha$ are expressible in terms of $\dot{q}''_{min}$ and $\dot{q}''_{max}$ as $$\dot{q}''_o = \frac{1}{2}(\dot{q}''_{min} + \dot{q}''_{max}) \quad (7)$$

$$\alpha = \frac{1 - \dot{q}''_{min}/\dot{q}''_{max}}{1 + \dot{q}''_{min}/\dot{q}''_{max}} \quad (8)$$

The non-uniform pin density $\beta$ is related to the non-uniform heat flux $\dot{q}''$ simply as $$\beta = \beta_o \left( \frac{\dot{q}''}{\dot{q}''_o} \right) \quad (9)$$

where $\beta_o$ is the mean pin density over the spreader plate in the flow direction, pins/ft. The mean pin density $\beta_o$ can be interpreted as the linear pin density in the flow direction with uniform heat flux over the spreader plate.

Introducing Equation (6) into Equation (9), the non-uniform pin density $\beta$ can be expressed as $$\beta = \beta_o \left[ 1 + \alpha \cos\left(\frac{\pi x}{a}\right) \right] \quad (10)$$

which mirrors the non-uniform heat flux $\dot{q}''$ distribution given in Equation (6).

Figure 11:
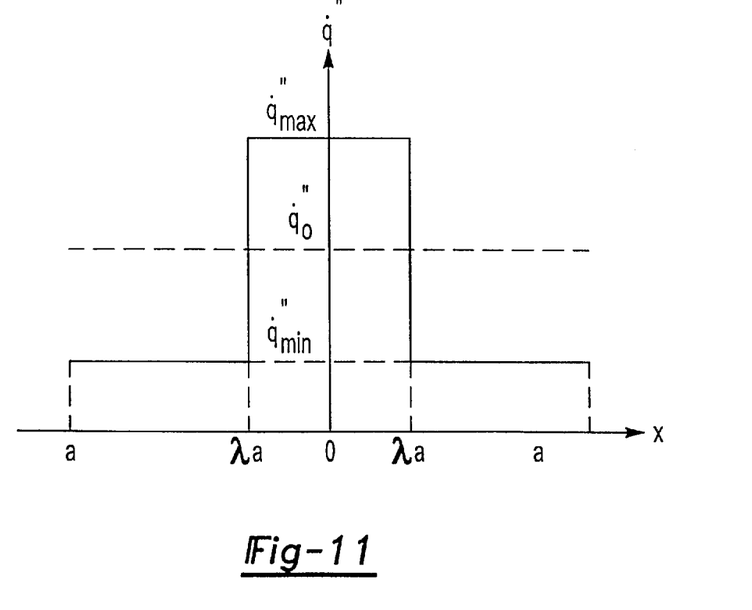
FIG. 11 is a graph of the non-uniform heat flux over the spreader plate as a step function.

In some cases, the non-uniform heat flux $\dot{q}''$ over the spreader plate can be represented by the step function as shown in FIG. 11. Analytically, this non-uniform heat flux can be represented as $$\dot{q}'' = \dot{q}''_{max} \text{ for } 0 \leq x \leq \lambda a \quad (11)$$

$$\dot{q}'' = \dot{q}''_{min} \text{ for } \lambda a < x \leq a \quad (12)$$

where
$\lambda$ is the fraction of the spreader plate width with maximum heat flux.

The non-uniform pin density $\beta$ in this case also is given in Equation (9). Introducing, Equations (11) and (12) into Equation (9), we obtain the non-uniform pin density $\beta$ over the spreader plate as $$\beta = \beta_o \left(\frac{\dot{q}''_{max}}{\dot{q}''_o}\right) \text{ for } 0 \leq x \leq \lambda a \quad (13)$$

$$\beta = \beta_o \left(\frac{\dot{q}''_{min}}{\dot{q}''_o}\right) \text{ for } \lambda a < x \leq a \quad (14)$$

where the mean heat flux $\dot{q}''_o$ over the spreader plate is given in Equation (7).

Knowing the non-uniform pin density $\beta$ from the above relations, the number of pins N at any distance x along the spreader plate width can be determined simply from the relation $$N = \beta l \quad (15)$$

where l is the spreader plate length normal to the spreader plate width $2a$.

Four numerical examples are given below to illustrate how to apply the teachings of the present invention with the use of Equations (1)–(15).

EXAMPLE 1

It is required to determine the optimum height b of the pin fin of circular cross section with diameter d=0.125 inch to dissipate heat from an electronic device employing aluminum pins with thermal conductivity $k_f$=133 Btu/ft hr° F. and commercially available open cell foam with linear density n=20 pores per inch and porosity $\phi$=0.90. The cooling medium is the ambient air flowing with a mean velocity $u_m$=10 ft/s. The transport properties of the ambient air are as follows.

Density $\rho$=0.0749 $lb_m$/ft$^3$

Thermal conductivity k=0.0000041 Btu/ft s° F.

Isobaric specific heat $c_p$=0.2410 Btu/$lb_m$° F.

Dynamic viscosity $\mu$=0.0000123 $lb_m$/ft s.

As a prelude to the calculation of the optimum pin height b using Equation (1), the appropriate convective heat transfer coefficient h is calculated using Equation (2). Upon introducing into Equation (2), n=20×12=240 pores per ft., $\phi$=0.90, $\rho$=0.0749 $lb_m$/ft$^3$, k=0.0000041 Btu/ft s° F., $c_p$=0.2410 Btu/$lb_m$° F., $\mu$=0.0000123 $lb_m$/ft s and $u_m$=10 ft/s, the heat transfer coefficient h=0.0313 Btu/ft$^2$s° F. is obtained.

Next, the ratio of the cross sectional area $A_c$ to perimeter p for the circular pin fin is determined. As per Table 1, for circular pin $A_c/p$=d/4 where d is the diameter of the pin. With d=0.125 inch=0.0104 ft, we obtain $A_c/p$=0.0026 ft.

Finally, introducing h=0.0313 Btu/ft$^2$s° F., $A_c/p$=0.0026 ft. and $k_f$=133/3600=0.0369 Btu/ft s° F. into Equation (1), the optimum pin height b=0.0509 ft=0.6110 inch is obtained.

EXAMPLE 2

It is required to determine the optimum height b of the pin fin of equilateral triangular cross section to dissipate heat from an electronic device employing aluminum pins with thermal conductivity $k_f$=133 Btu/ft hr° F. and commercially available open cell foam with linear density n=20 pores per inch and porosity $\phi$=0.90. The side d of the equilateral triangular pin is to be selected in such a fashion that the perimeter p of the pin is the same as the perimeter of the circular pin of Example 1 with diameter 0.125 inch.

The cooling medium is the ambient air flowing with a mean velocity $u_m$=10 ft/s. The transport properties of the ambient air are as follows.

Density $\rho$=0.0749 $lb_m$/ft$^3$

Thermal conductivity k=0.0000041 Btu/ft s° F.

Isobaric specific heat $c_p$=0.2410 Btu/$lb_m$° F.

Dynamic viscosity $\mu$=0.0000123 $lb_m$/ft s.

As a prelude to the calculation of the optimum pin height b using Equation (1), the appropriate convective heat transfer coefficient h is calculated using Equation (2). Upon introducing into Equation (2), n=20×12=240 pores per ft., $\phi$=0.90, $\rho$=0.0749 $lb_m$/ft$^3$, k=0.0000041 Btu/ft s° F., $c_p$=0.2410 Btu/$lb_m$° F., $\mu$=0.0000123 $lb_m$/ft s and $u_m$=10 ft/s, the heat transfer coefficient h=0.0313 Btu/ft$^2$s° F. is obtained.

In order to determine the ratio of the cross sectional area $A_c$ to perimeter p for the equilateral triangular pin fin, the side d of the pin must first be determined. As per the example statement, the perimeter p of the equilateral triangular pin must match the perimeter of the circular pin of Example 1. Knowing that the diameter of the circular pin of Example 1 is 0.125 inch, it follows that the perimeter of the circular pin is $\pi$×0.125=0.3927 inch. Since the perimeter p of the equilateral triangular pin is 3d, it follows that 3d=0.3927 inch whence d=0.1309 inch=0.0109 ft. As per Table 1, for equilateral triangular pin $A_c/p$=d/4$\sqrt{3}$. Introducing d=0.0109 ft, the resulting $A_c/p$=0.0016 ft is obtained.

Finally, introducing h=0.0313 Btu/ft$^2$s° F., $A_c/p$=0.0016 ft. and $k_f$=133/3600=0.0369 Btu/ft s° F. into Equation (1), the optimum pin height b=0.0396 ft=0.4751 inch is obtained. On comparing this height with the height 0.6110 inch of the circular pin in Example 1, it is noticed that the optimum height of the equilateral triangular pin is less than that of the circular pin. This is to be expected in view of the fact that the optimum height is proportional to $\sqrt{A_c/p}$ as per Equation (1) and for a given perimeter the ratio $A_c/p$ is the maximum for circular pin.

EXAMPLE 3

It is required to determine the non-uniform pin fin density over the surface of a square spreader plate with side $2a$=5 in. It is found that with uniform heat flux $\dot{q}''_o$ over the spreader plate the mean pin density $\beta_o$ in the fluid flow direction is given as $\beta_o$=10 pins/inch. It is required to determine the non-uniform pin density β across the spreader plate width if a non-uniform heat flux $\dot{q}''$, represented by the cosine function in Equation (6). This requirement is imposed by the electronics device bonded on the opposite unfinned surface of the spreader plate. The maximum heat flux $\dot{q}''_{max}$ at the center of the spreader plate is twice the minimum heat flux $\dot{q}''_{min}$ at the edge of the spreader plate, i.e., $\dot{q}''_{max}/\dot{q}''_{min}$=2 or $\dot{q}''_{min}/\dot{q}''_{max}$=½.

As a prelude to the determination of the non-uniform pin density β, first the dimensionless constant cc with the use of Equation (8) is determined. By the problem statement, $\dot{q}''_{min}/\dot{q}''_{max}$=0.5. Introducing this value into Equation (8), a value of α=⅓ is obtained. Introducing this value of α together with the spreader plate half-width a=2.5 inches and the mean pin density $\beta_o$=10 pins/inch, the local pin density across the spreader plate width with the use of Equation (10) is determined. Thus, knowing the local pin density β, the number of pins N at any distance x is calculable with the use of Equation (15). The spreader plate length l entering Equation (15) is equal to the spreader plate width 2a since the plate is a square. Thus l=2a=5 in. The calculated values of β and N at representative distances x (vide FIG. 10) are presented in the following table:

| x, in. | 0 | ±0.625 | ±1.250 | ±1.875 | ±2.500 |
|---|---|---|---|---|---|
| β, pins/in. | 13.3 | 12.4 | 10.0 | 7.6 | 6.6 |
| N, pins | 67 | 62 | 50 | 38 | 33 |

EXAMPLE 4

It is required to determine the pin fin density over the surface of a square spreader plate with side 2a=5 in. It is found that with uniform heat flux $\dot{q}''_o$ over the spreader plate the mean pin density in the fluid flow direction $\beta_o$=10 pins/in. It is required to determine the non-uniform pin density β across the spreader plate width if a non-uniform heat flux $\dot{q}''$, represented by the step function of Equations (11) and (12), is imposed by the electronics device bonded on the opposite unfinned surface of the spreader plate. The maximum heat flux $\dot{q}''_{max}$ at the center of the spreader plate is twice the minimum heat flux $\dot{q}''_{min}$ at the edge of the spreader plate i.e., $\dot{q}''_{max}/\dot{q}''_{min}$=2 or $\dot{q}''_{min}/\dot{q}''_{max}$=½. The maximum heat flux $\dot{q}''_{max}$ is imposed over 25% of the spreader plate width so that the fraction λ=0.25.

As a prelude to the determination of the non-uniform pin density β using Equations (13) and (14), the flux ratios $\dot{q}''_{max}/\dot{q}''_o$ and $\dot{q}''_{min}/\dot{q}''_o$ must first be determined. This is easily done by introducing the flux ratio $\dot{q}''_{min}/\dot{q}''_{max}$=0.5 into Equation (7). Thus, the values $\dot{q}''_{max}/\dot{q}''_o$=4/3 and $\dot{q}''_{min}/\dot{q}''_o$=⅔ are obtained. Introducing these values together with spreader plate half-width a=2.5 in. and the mean pin density in the fluid flow direction $\beta_o$=10 pins/inch into Equations (13) and (14), the desired values of the local pin density β in the two regions of the spreader plate is obtained. Therefore, knowing the local pin density β, the number of pins N at any distance x are calculable with the use of Equation (15). The spreader plate length l entering Equation (15) is equal to the spreader plate width 2a since the plate is a square. Thus, l=2a=5 in. The calculated values of β and N for the appropriate ranges of x (vide FIG. 11) are presented in the following table:

| x, in. | β, pins/in. | N, pins |
|---|---|---|
| −0.625 ≤ x ≤ 0.625 | 13.3 | 67 |
| 0.625 < x ≤ 2.5 | 6.7 | 33 |
| −2.5 ≤ x < −0.625 | 6.7 | 33 |

In the foregoing description those skilled in the art will readily appreciate that modifications may be made to the invention without departing from the concepts disclosed herein. Such modifications are to be considered as included in the following claims, unless these claims expressly state otherwise.

We claim:

1. A heat sink for electronic devices, said heat sink comprising:

a spreader plate having a top surface and having a bottom surface, a portion thereof defined for affixing an electronic device to be cooled thereto;

a plurality of columnar pins spaced apart one from the other in a non-uniform manner and affixed to said top surface of said spreader plate substantially perpendicular thereto with each of said pins having a height; and a highly porous heat conducting reticulated foam block substantially filling a space defined by said spaced apart columnar pins;

wherein said height of each of said pins is determined by a configuration of said pins, a thermal conductivity of said pins, and a convective heat transfer coefficient of said foam block such that said height of each of said pins is directly related to the type of foam block filling said space between said pins.

2. The heat sink according to claim 1 wherein said plurality of columnar pins comprises a first plurality of columnar pins in registration with said portion for affixing the electronic device thereto defining a first distribution density, and a second plurality of columnar pins not in registration with said portion and defining a second distribution density.

3. The heat sink according to claim 2 wherein said first plurality of columnar pins and said second plurality of columnar pins have a like cross-sectional geometry.

4. The heat sink according to claim 2 wherein said first distribution density is more dense than said second distribution density.

5. The heat sink of claim 2 wherein a density of said pins in registration with said portion for affixing the electronic device thereto is determined by the relationship:

$$\beta = \beta_o \left( \frac{\dot{q}''_{max}}{\dot{q}''_o} \right) \text{ for } 0 \le x \le \lambda a$$

where:

$\beta_o$ is the mean pin density over the spreader plate in the flow direction, pins/ft. The mean pin density $\beta_o$ can be interpreted as the linear pin density in the flow direction with uniform heat flux over the spreader plate;

λ is the fraction of the spreader plate width with maximum heat flux;

x is the variable distance measured from the center of the spreader plate along its width, ft;

a is the spreader plate half-width, ft.; and where the mean heat flux $\dot{q}''_o$ over the spreader plate is given by the Equation:

$$\dot{q}''_o = \tfrac{1}{2}(\dot{q}''_{min} + \dot{q}''_{max})$$

where:

$\dot{q}''_{min}$ is the minimum heat flux over the spreader plate; and $\dot{q}''_{max}$ is the maximum heat flux over the spreader plate.

6. The heat sink of claim 5 wherein a density of said pins on an area of said spreader plate not in registration with said portion for affixing the electronic device thereto is determined by the relationship:

$$\beta = \beta_o\left(\frac{\dot{q}''_{min}}{\dot{q}''_o}\right) \text{ for } \lambda a < x \le a$$

where:

$\beta_o$ is the mean pin density over the spreader plate in the flow direction, pins/ft. The mean pin density $\beta_o$ can be interpreted as the linear pin density in the flow direction with uniform heat flux over the spreader plate;

$\lambda$ is the fraction of the spreader plate width with maximum heat flux;

x is the variable distance measured from the center of the spreader plate along its width, ft.;

a is the spreader plate half-width, ft.; and where the mean heat flux $\dot{q}''_o$ over the spreader plate is given by the Equation:

$$\dot{q}''_o = \tfrac{1}{2}(\dot{q}''_{min} + \dot{q}''_{max})$$

where:

$\dot{q}''_{min}$ is the minimum heat flux over the spreader plate; and $\dot{q}''_{max}$ is the maximum heat flux over the spreader plate.

7. The heat sink of claim 1 wherein said spreader plate, said columnar pins and said heat conducting foam are made from the same thermal conducting material.

8. The heat sink of claim 1 wherein each said spreader plate, said columnar pins and said heat conducting foam are individually made from one of the group, aluminum, copper, graphite, and aluminum nitride ceramic.

9. The heat sink of claim 1 wherein said spreader plate, said columnar pins and said heat conductive foam are made from aluminum.

10. The heat sink of claim 1 wherein said configuration of each of said pins is defined by a cross sectional area of said pin and a perimeter of said pin.

11. The heat sink according to claim 10 wherein said height, b, of said columnar pins is determined by the relationship:

$$b = 0.919\sqrt{\frac{k_f}{h}\frac{A_c}{p}}$$

where:

$k_f$ is the thermal conductivity of the pin material, Btu/ft s° F.

$A_c$ is the cross sectional area of the pin, ft²;

p is the perimeter of the pin, ft,; and h is the convective heat transfer coefficient for the foam-filled space bounded by the pins and the spreader plate, Btu/ft² s° F., and is given by the formula:

$$h = 1.2704\left[\frac{n^{0.50}}{(1-\phi)^{0.25}}\right]\left[\frac{\rho^{0.50}k^{0.63}c_p^{0.37}}{\mu^{0.13}}\right]u_m^{0.50}$$

where:

n is the linear density of the foam material, pores per ft.;

$\phi$ is the foam porosity expressed as a fraction;

$\rho$ is the density of the flowing fluid, $lb_m/ft^3$;

k is the thermal conductivity of the flowing fluid, Btu/ft s° F.;

$c_p$ is the isobaric specific heat of the flowing fluid, Btu/$lb_m$° F.;

$\mu$ is the dynamic viscosity of the flowing fluid, $lb_m$/ft s; and $u_m$ is the mean velocity of the flowing fluid, ft/s.

12. A method of making a heat sink comprising a spreader plate, a plurality of columnar pins and a reticulated foam block for filling the space between the columnar pins, the method comprising the steps of:

selecting the spreader plate;

defining a portion on the bottom surface of the spreader plate for affixing to an electronic device;

selecting the reticulated foam block;

determining the convective heat transfer coefficient of the selected foam block;

determining a required configuration for each of the pins;

determining a required thermal conductivity for each of the pins;

determining a height for each of the pins based upon the determined configuration for the pin, the determined thermal conductivity for the pin, and the determined convective heat transfer coefficient for the foam block;

selecting the plurality of columnar pins based upon the determined configuration, thermal conductivity, and height for the pins such that the selection of the pins is directly related to the type of foam block selected;

affixing the plurality of columnar pins to the top surface of the spreader plate such that the columnar pins are arranged in a non-uniform density on the top surface of the spreader plate;

placing the reticulated foam block to fill the spaces between the columnar pins affixed to the spreader plate; and affixing the reticulated foam block to the spreader plate and to the plurality of columnar pins.

13. The method according to claim 12 wherein the step of affixing the plurality of columnar pins to the top surface of the spreader plate is such that a first plurality of columnar pins are affixed over the area defined for the electronic device at a greater density than a density of a second plurality of columnar pins affixed to the remainder of the top surface of the spreader plate.

14. The method according to claim 13 wherein the density of the first plurality of columnar pins is determined by the relationship:

$$\beta = \beta_o\left(\frac{\dot{q}''_{max}}{\dot{q}''_o}\right) \text{ for } 0 \le x \le \lambda a$$

where:

$\beta_o$ is the mean pin density over the spreader plate in the flow direction, pins/ft. The mean pin density $\beta_o$ can be interpreted as the linear pin density in the flow direction with uniform heat flux over the spreader plate;

λ is the fraction of the spreader plate width with maximum heat flux;

x is the variable distance measured from the center of the spreader plate along its width, ft.;

a is the spreader plate half-width, ft.; and where the mean heat flux $\dot{q}''_o$ over the spreader plate is given by the Equation:

$$\dot{q}''_o = \tfrac{1}{2}(\dot{q}''_{min} + \dot{q}''_{max})$$

where:

$\dot{q}''_{min}$ is the minimum heat flux over the spreader plate; and $\dot{q}''_{max}$ is the maximum heat flux over the spreader plate.

15. The method according to claim 13 wherein the density of the second plurality of columnar pins is determined by the relationship:

$$\beta = \beta_o \left( \frac{\dot{q}''_{min}}{\dot{q}''_o} \right) \text{ for } \lambda a < x \leq a$$

where:

β$_o$ is the mean pin density over the spreader plate in the flow direction, pins/ft. The mean pin density β$_o$ can be interpreted as the linear pin density in the flow direction with uniform heat flux over the spreader plate;

λ is the fraction of the spreader plate width with maximum heat flux;

x is the variable distance measured from the center of the spreader plate along its width, ft.;

a is the spreader plate half-width, ft.; and where the mean heat flux $\dot{q}''_o$ over the spreader plate is given by the Equation:

$$\dot{q}''_o = \tfrac{1}{2}(\dot{q}''_{min} + \dot{q}''_{max})$$

where:

$\dot{q}''_{min}$ is the minimum heat flux over the spreader plate; and $\dot{q}''_{max}$ is the maximum heat flux over the spreader plate.

16. The method according to claim 12 wherein:

the step of affixing the plurality of columnar pins to the spreader plate is accomplished using one of the group of a thermally conductive adhesive and furnace brazing; and the step of affixing the reticulated foam block to the spreader plate and to the columnar pins is accomplished using one of the group of a thermally conductive adhesive and furnace brazing.

17. The method according to claim 11 wherein the step of determining the height, b, of the selected pins is determined by the relationship:

$$b = 0.919 \sqrt{\frac{k_f}{h} \frac{A_c}{p}}$$

where:

$k_f$ is the thermal conductivity of the pin material, Btu/ft s° F.

$A_c$ is the cross sectional area of the pin, ft²;

p is the perimeter of the pin, ft.; and h is the convective heat transfer coefficient for the foam-filled space bounded by the pins and the spreader plate, Btu/ft²s° F., and is given by the formula:

$$h = 1.2704 \left[ \frac{n^{0.50}}{(1-\phi)^{0.25}} \right] \left( \frac{\rho^{0.50} k^{0.63} c_p^{0.37}}{\mu^{0.13}} \right) u_m^{0.50}$$

where:

n is the linear density of the foam material, pores per ft;

φ is the foam porosity expressed as a fraction;

ρ is the density of the flowing fluid, lb$_m$/ft³;

k is the thermal conductivity of the flowing fluid, Btu/ft s° F.;

$c_p$ is the isobaric specific heat of the flowing fluid, Btu/lb$_m$° F.;

μ is the dynamic viscosity of the flowing fluid, lb$_m$/ft s; and $u_m$ is the mean velocity of the flowing fluid, ft/s.

18. The method according to claim 12 wherein the spreader plate, the columnar pins, and the reticulated foam are fabricated from one of the materials of the group, aluminum, copper, graphite, and aluminum-nitride ceramic.

19. The method according to claim 12 wherein the spreader plate, the columnar pins, and the reticulated foam are fabricated from aluminum.

20. The method according to claim 12 wherein the step of determining the required configuration for each of the pins is further defined by determining a cross sectional area of the pin and determining a perimeter of the pin.

21. A method of cooling electronic components with a heat sink of the type having a spreader plate with a plurality of columnar pins affixed in a non-uniform density to a top surface of the spreader plate and having a reticulated heat conducting foam filling the space between the plurality of columnar pins, said method comprising the steps of:

affixing the electronic device to a bottom surface of the spreader plate;

selecting the reticulated heat conducting foam;

determining the convective heat transfer coefficient of the selected foam;

determining a required configuration for each of the pins;

determining a required thermal conductivity for each of the pins;

determining a height for each of the pins based upon the determined configuration for the pin, the determined thermal conductivity for the pin, and the determined convective heat transfer coefficient for the foam;

selecting the plurality of columnar pins based upon the determined configuration, thermal conductivity, and height for the pins such that the selection of the pins is directly related to the type of foam selected;

arranging a first plurality of columnar pins on the top surface of the spreader plate over the electronic device at a greater density than a second plurality of columnar pins over the remainder of the spreader plate;

affixing the heat conducting foam to fill the space between adjacent ones of the first and second columnar pins; and passing a cooling fluid over the top surface of the spreader plate and through the heat conducting foam.

22. The method according to claim 21 wherein the electronic device is affixed to the bottom of the spreader plate with a heat conductive material interposed between the spreader plate and the affixed surface of the electronic device.

23. The method according to claim 21 wherein the step of determining the required configuration for each of the pins is further defined by determining a cross sectional area of the pin and determining a perimeter of the pin.

24. The method according to claim 19 wherein the density of the first plurality of columnar pins is determined by the relationship:

$$\beta = \beta_o \left( \frac{\dot{q}''_{max}}{\dot{q}''_o} \right) \text{ for } 0 \leq x \leq \lambda a$$

where:

$\beta_o$ is the mean pin density over the spreader plate in the flow direction, pins/ft. The mean pin density $\beta_o$ can be interpreted as the linear pin density in the flow direction with uniform heat flux over the spreader plate;

$\lambda$ is the fraction of the spreader plate width with maximum heat flux;

x is the variable distance measured from the center of the spreader plate along its width, ft.;

a is the spreader plate half-width, ft,; and where the mean heat flux $\dot{q}''_o$ over the spreader plate is given by the Equation:

$$\dot{q}''_o = \frac{1}{2}(\dot{q}''_{min} + \dot{q}''_{max})$$

where:

$\dot{q}''_{min}$ is the minimum heat flux over the spreader plate; and $\dot{q}''_{max}$ is the maximum heat flux over the spreader plate.

25. The method according to claim 18 wherein the density of the second plurality of columnar pins is determined by the relationship:

$$\beta = \beta_o \left( \frac{\dot{q}''_{min}}{\dot{q}''_o} \right) \text{ for } \lambda a < x \leq a$$

where:

$\beta_o$ is the mean pin density over the spreader plate in the flow direction, pins/ft. The mean pin density $\beta_o$ can be interpreted as the linear pin density in the flow direction with uniform heat flux over the spreader plate;

$\lambda$ is the fraction of the spreader plate width with maximum heat flux;

x is the variable distance measured from the center of the spreader plate along its width, ft.;

a is the spreader plate half-width, ft.; and where the mean heat flux $\dot{q}''_o$ over the spreader plate is given by the Equation:

$$\dot{q}''_o = \frac{1}{2}(\dot{q}''_{min} + \dot{q}''_{max})$$

where:

$\dot{q}''_{min}$ is the minimum heat flux over the spreader plate; and $\dot{q}''_{max}$ is the maximum heat flux over the spreader plate.

26. The method according to claim 23 wherein the step of determining the height, b, of the selected pins is determined according to the relationship:

$$b = 0.919 \sqrt{\frac{k_f}{h} \frac{A_c}{p}}$$

where:

$k_f$ is the thermal conductivity of the pin material, Btu/ft s° F.;

$A_c$ is the cross sectional area of the pin, ft$^2$;

p is the perimeter of the pin, ft.; and h is the convective heat transfer coefficient for the foam-filled space bounded by the pins and the spreader plate, Btu/ft$^2$ s° F., and is given by the formula:

$$h = 1.2704 \left[ \frac{n^{0.50}}{(1-\phi)^{0.25}} \right] \left( \frac{\rho^{0.50} k^{0.63} c_p^{0.37}}{\mu^{0.13}} \right) u_m^{0.50}$$

where, n is the linear density of the foam material, pores per ft.;

$\phi$ is the foam porosity expressed as a fraction;

$\rho$ is the density of the flowing fluid, lb$_m$/ft$^3$;

k is the thermal conductivity of the flowing fluid, Btu/ft s° F.;

$c_p$ is the isobaric specific heat of the flowing fluid, Btu/lb$_m$° F.;

$\mu$ is the dynamic viscosity of the flowing fluid, lb$_m$/ft s.; and $u_m$ is the mean velocity of the flowing fluid, ft/s.

\* \* \* \* \*